United States Patent [19]

Guo

[11] Patent Number: 5,619,148
[45] Date of Patent: Apr. 8, 1997

[54] DIGITAL VARIABLE IN-LOCK RANGE PHASE COMPARATOR

[75] Inventor: Bin Guo, Fremont, Calif.

[73] Assignee: Advanced Micro Devices, Inc., Sunnyvale, Calif.

[21] Appl. No.: 541,386

[22] Filed: Oct. 10, 1995

Related U.S. Application Data

[63] Continuation of Ser. No. 21,710, Feb. 24, 1993, abandoned.

[51] Int. Cl.$^6$ ................................................ H03K 5/22
[52] U.S. Cl. .......................... 327/3; 327/9; 327/10; 327/12
[58] Field of Search ................................. 328/133, 134, 328/155; 307/514, 516; 331/1 A, 17, 25; 375/120; 327/2, 3, 7, 9, 10, 12

[56] References Cited

U.S. PATENT DOCUMENTS

| | | | |
|---|---|---|---|
| 3,931,585 | 1/1976 | Barker et al. | 327/5 |
| 4,050,024 | 9/1977 | Winston, IV | 328/134 |
| 4,580,101 | 4/1986 | Lax | 375/120 |
| 4,599,570 | 7/1986 | Cloke | 328/134 |
| 4,635,280 | 1/1987 | Smith et al. | 328/155 |
| 4,773,085 | 9/1988 | Cordell . | |
| 4,876,699 | 10/1989 | Nelson . | |
| 4,901,026 | 2/1990 | Phillips et al. | 328/133 |
| 4,904,948 | 2/1990 | Asami | 307/514 |
| 4,932,041 | 6/1990 | Eiberger et al. | 375/120 |
| 4,940,952 | 7/1990 | Kegasa | 328/134 |
| 5,159,279 | 10/1992 | Shenoi et al. | 331/1 A |
| 5,180,933 | 1/1993 | Krzyzanowski | 328/133 |
| 5,260,975 | 11/1993 | Saito | 328/133 |
| 5,297,173 | 3/1994 | Hikmet et al. . | |
| 5,321,369 | 6/1994 | Wolaver | 328/133 |

FOREIGN PATENT DOCUMENTS

| | | |
|---|---|---|
| 0010077 | 4/1980 | European Pat. Off. . |
| 0500473 | 8/1992 | European Pat. Off. . |

*Primary Examiner*—Timothy P. Callahan
*Assistant Examiner*—T. Lam
*Attorney, Agent, or Firm*—Gerald M. Fisher

[57] ABSTRACT

A novel method and apparatus providing an all digital phase comparator of two binary signals which employs a type of cross correlation of two binary signals and provides a 2bit binary word uniquely representative of phase alignment. The method can be carried out using a pair of flip-flop (FF) circuits, each FF having a docking input and a data input, and where each FF has a delay in series with its data input.

17 Claims, 9 Drawing Sheets

DIGITAL VARIABLE IN-LOCK RANGE PHASE COMPARATOR

This application is a continuation of application Ser. No. 08/021,710 filed Feb. 24, 1993, now abandoned.

FIELD OF INVENTION

This invention relates to digital phase comparators, and phase analyzers and particularly to an all digital method and apparatus for phase alignment, delay regulation and signal synchronization.

RELATED APPLICATIONS

The applicant has simultaneously filed the below listed patent applications, which relate to aspects of high data rate digital data/clock recovery systems, said applications are incorporated herein by reference:

1. "All Digital High Speed Algorithmic Data Recovery Scheme and Apparatus Using Locally Generated Compensated Broad Band Time Ruler and Edge Position Averaging," Ser. No. 08/021,924; filing date Feb. 24, 1993 inventor Bin Guo; AMD Docket Number A895.

2. "Digital Full Range Rotating Phase Shifter," Ser. No. 08/021,691; filing data Feb. 24, 1993; inventor Bin Guo; AMD Docket Number A894.

BACKGROUND

In clock/data recovery and various phase/timing control operations, phase or timing adjustments are often performed after a phase or timing error is detected. A phase detector or comparator is necessary for both traditional, analog-based Phase Locked Loop (PLL) and for digital, delay line based systems. Even in analog based PLL systems, it is known for the phase detector to use digital circuits, such as the balanced modulator circuit using exclusive-OR gates and the sequential phase detector or so-called "9 gate phase detector" using a number of cross-coupled RS flip-flops. However, the output from those types of phase detector circuits can not be directly used by the subsequent circuitry which receives the output signal representative of phase error. This is because the magnitude of the phase error is represented either in the form of pulse width of the output signal, such as the case of the balanced modulator, or in a form of the pulse width difference between two output signals, such as the case of the sequential phase detector. In analog based phase detector systems, the function of the phase detector is to provide an output voltage proportional to the phase difference of two periodic input signals at the same frequency. Conversion of pulse width to voltage is then necessary. The digital output signal from the phase detector is converted into an analog voltage by using, for example, a so called charge pump and a low pass filter. This analogue voltage error signal is then used to control a Voltage Controlled Oscillator (VCO), which changes the oscillator frequency to slowly achieve the phase adjustment or alignment over a number of cycles, since the amount of the necessary phase change is the integral of the difference between the VCO frequency and the reference frequency.

APPLICATION OF THE INVENTION

Delay techniques have become achievable for use in digital data recovery or signal synchronization applications due to the fact that integrated circuit technology especially the reduction of the CMOS feature size, has reduced a single gate delay to the sub-nanosecond range. In my co-filed related applications, cited above, I disclose use of a plurality of delay cells cascaded to form a delay line which is used to delay a signal, whether data, clock or a control signal, to provide a plurality of delayed, or phase shifted copies of the original signal from the contacts or taps from the delay line. The delay path is adjusted by selecting the taps of the delay line to choose a proper delay or phase shifting amount for the purpose of aligning the phase of the delayed signal to a reference signal. To determine whether two digital signals are in alignment, a phase decision or detection circuit is required.

Various types of phase comparison circuits can be used. The delayed signals can be sampled, or detected, or registered to be analyzed in subsequent logic to determine their phase relationship with reference signal or signals, and therefore, signal synchronization, data recovery and other tasks can be performed. If they are not in alignment or the phase offset exceeds a specified value, delay adjustments can be initiated by informing the delay path selector to either increment or decrement a delay stage. A single binary output control signal indicating adjustment direction, i.e. up or down, and an adjustment enable signal indicating the "in-lock" condition to the delay-phase adjust control circuit is needed since the delay adjustment control circuit could thus be reduced to a simple, bi-directional shift register.

One application of such a phase comparator is used in the simultaneously filed related application, "Digital Full Range Rotating Phase Shifter," AMD Docket Number A894, Ser. No. 08/021,691 filed Feb. 24, 1993. Here, a phase shift range calibrator is used to constantly monitor the delay variation to provide a digital code to the delay-phase adjust circuit to establish the End Stage Pointer (ESP) location which indicates the delay range which corresponds to the 360 degree phase shifting range. The range calibrator uses a bi-directional shifter register which up-down shifts a single "1" for selecting a delay path from the digitally adjustable delay line. A phase comparator is required to compare the phase of the output signals from two identical delay lines—one is a delay line with a selected delay path, and the other is a delay line with zero stages selected or only the intrinsic delay. In this co-filed application, the output of the phase comparator needs to be a binary up-down signal indicating the shift direction and an enable signal which can "freeze" the selection when it determines that the phase offset is or has become within a pre-specified range of 360 degree.

Another requirement for such comparators is that the phase comparator should be able to distinguish between $2\pi$, $4\pi$, etc. and determine if the two signals are $n\pi$ out of phase, where n=2, i.e., the time delay interval of a single period between a phase shifted signal and the original signal. Phase shifting of 0°, 720° or $n\pi$ where n>2 are not acceptable.

SUMMARY OF THE INVENTION

A principal objective of the present invention is to provide an all digital phase comparator apparatus and method.

A further objective of the invention is to provide a simple digital scheme that employs primarily a pair of flip flops and outputs a binary up/down control signal.

A further objective is to provide a coarse range indication and a fine range indication such as in-range and in-lock respectively.

A further objective is to have a circuit scheme that is simple in structure, and that uses only standard logic components which are suitable for digital integrated circuit implementations.

A feature of this invention is that it provides preselectable phase range detection zones created by using multiple pairs of D-flip flop sets each of which employs a fixed or an programmable delay circuit.

A still further feature is that this scheme is able to work properly even if the signals to be compared are not 50% duty cycle signals.

BRIEF DESCRIPTION OF THE DRAWINGS

FIG. 1A-1 and FIG. 1A-2 and 1B are the circuit and timing diagrams of a prior art D-type Flip Flop (DFF), and DFF with delay in data path illustrating the concept of the Delay Ready Window (DRW) of the DFF and the DRW shifting respectively.

FIG. 4A-1 and FIG. 4A-2 are the modified circuit block diagram of the phase comparator in FIG. 2A when the signal is not 50% duty cycle or the two signals have different duty cycle.

DETAILED DESCRIPTION OF THE INVENTION

Figure 1A:
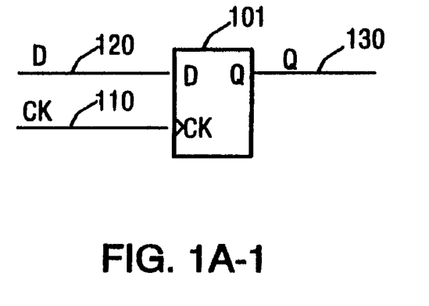

To understand the underlying concept of this invention, it is necessary to define the term "Data Ready Window," in conjunction with a D-type flip flop setup and hold time. D-type flip-flop (DFF) is widely used both in synchronous logic and asynchronous logic with synchronous operations to latch data or to sample logic status. FIG. 1A-1 is a block representing simple rising edge triggered D flip flop 101. The timing diagram is shown in FIG. 1B. With reference to FIG. 1B, a clock signal ck 110, a data input signal D 120, and an output signal Q 130 are shown. A "Data Ready Window" (DRW) 119 is defined as a time window having a certain relationship with respect to the clocking edge (the rising edge in this case). The Data Ready Window starts at a time instance before the clock rising edge, with time lapse equal to the setup time TS 116, and ends at an instant in time where the time lapse equal to the hold time TH 117 after the clocking edge. The total time lapse of the window DRW is the sum of the setup time TS 116 and the hold time TH 117, which is indicated by the cross-hatched area 119. In order for the DFF to always sample, i.e. latch, a logic level from the data input D upon the occurrence clocking edge, the data level has to be stable throughout the DRW period. For example, input data D changes to level "1" on edge 121, and stays at that level through the entire DRW period 119, so the "1" is latched by clocking edge 111 and output Q changes to "1" on edge 131. Similarly, input D stays "0" for the entire DRW period before it change to "1" on edge 122, so a "0" is latched by clocking edge 112 and output Q changes to "0" on edge 132. However, the data input D changes on edge 123 from "0" to "1" during DRW period, resulting in a logic level uncertainty or an "x" on output Q on edge 133. This is because neither "0" or "1" level remains constant throughout the DRW period 119. Level "0" may be considered to have satisfied the setup time requirement since it is established before the start of the DRW period 119, but it does not meet the hold time. It is just the opposite for level "1"—it satisfied the hold time requirement, but fails the setup time requirement. It can then be concluded that, whenever there is an edge or transition during the DRW period on data input D, an unknown logic level results at the output. This is also known as the metastability of a flip flop.

Figure 1A:
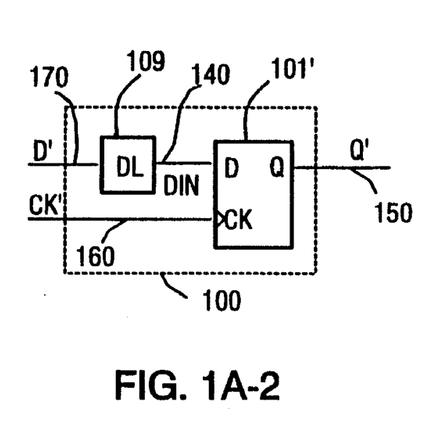
Figure 1B:
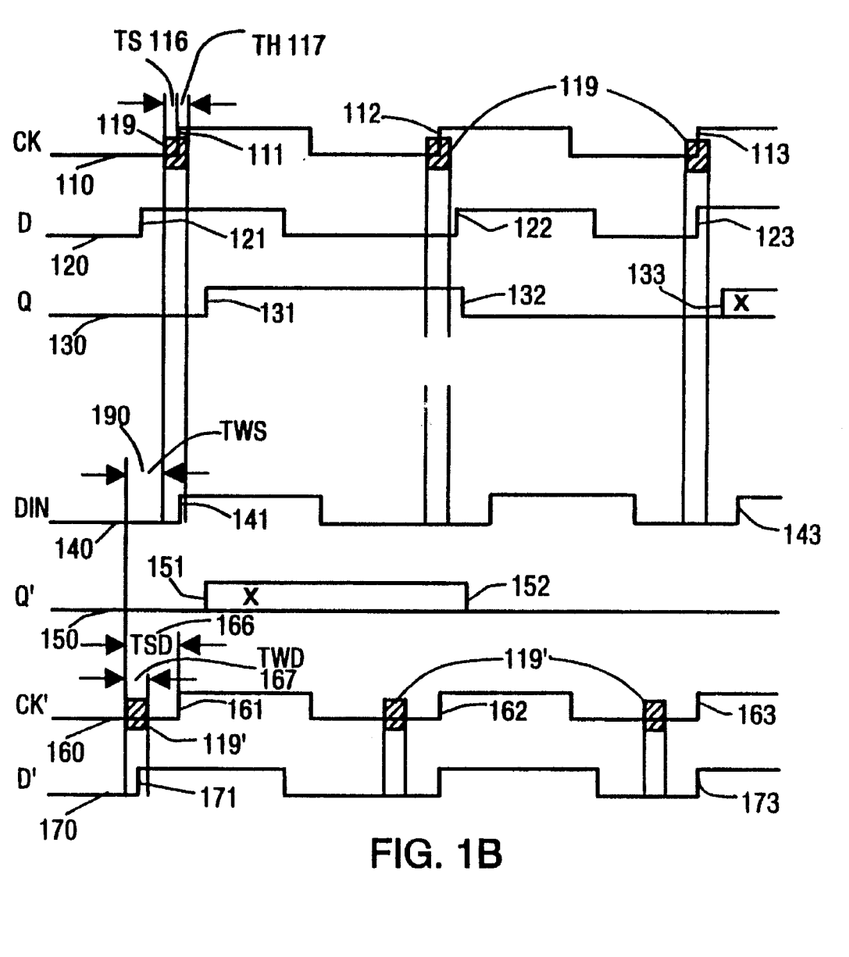

With reference to FIG. 1A-2, I insert a delay DL 109 in the data input path for circuit 100 outlined by dashed lines. The output DIN 140 of the delay DL, is the input to the DFF 101'. With reference to FIG. 1B timing diagram, the clock CK' 160 and data input D' 170 has the same timing relation as D and CK for DFF 101. However, the actual data input signal of DFF 101' is signal DIN 140, or the time "shifted" copy of the input signal D' 170. The waveform of output Q' 150 will not be the same as that of output Q 130 in FIG. 1A-1. Note that output Q' 150 would be unknown at time 151 since the input to the DFF 101', DIN 140 has a transition 141 within DRW 119, while edge 143 will not cause output unknown since it is not within the DRW 119. One can consider block 100, FIG. 1A-2, which includes both DFF 101' and DL 109, as a single DFF unit with a "shifted" DRW as indicated by cross-hatched area 119', then the output status can be derived directly by examining the time relation between the clock CK' 160, and the external data input D' 170. The same output waveform 150 will be obtained. Output Q' will become unknown at edge 151, since input D' 170 has a transition 171 during the DRW period 119'. There is no unknown status upon clocking edge 163, since the input D' has a stable level "0" during the DRW period 119' associated with clocking edge 163, even though clocking edge 163 coincides with edge 173 of the data input D'. In other words, the addition of a delay in the data input path effectively shifts the location of the DRW in respect to the clocking edge, by the amount of the time lapse equal to the delay value TWS 190 of the delay DL 109. Accordingly, I have defined a method for determining the output logic status for DFF 100 in FIG. 1A-2 as follows:

1. Determine the location and width of original DRW (without delay DL in the data input path) for the DFF using the setup and hold time;

2. Determine the shifted DRW location by shifting it to the left on the CK waveform for the amount equal to delay value of delay DL;

3. "Project" the shifted DRW associated with each clocking edge onto the data input waveform;

4. If the data waveform has a constant logic level during the time period projected by a DRW for a clocking edge, then:

the output will not change if it has the same logic level as the data input;

the output changes to the level of the data input at the occurrence of the clocking edge plus a clock-to-Q delay if the output is at a different logic level than the data input.

5. If the data waveform has one or more transitions during the DRW projected time period, the output becomes unknown upon the clocking edge plus a clock-to-Q delay.

Figure 2A:
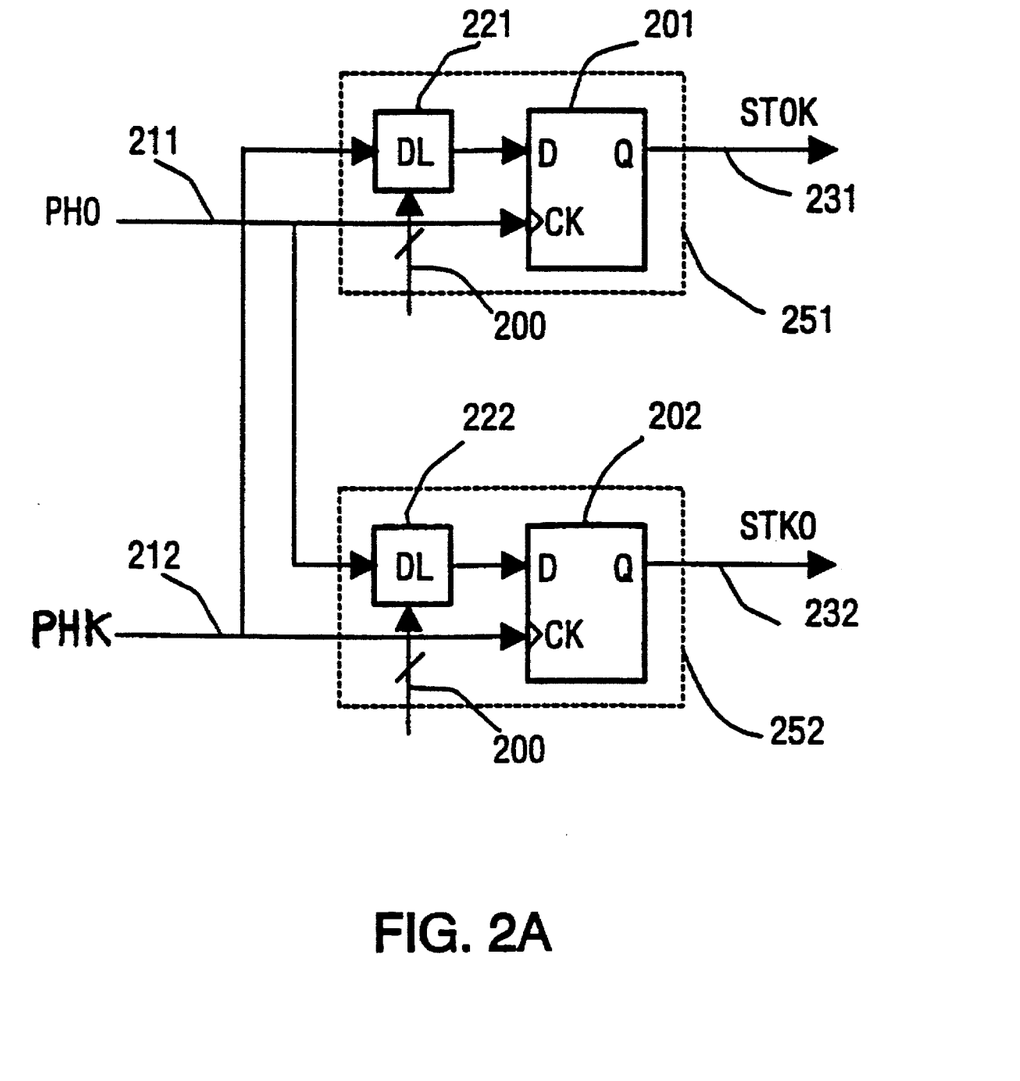
FIG. 2A is the circuit block diagram of a simplified adjustable dual in-lock range phase comparator for phase decision circuits.
Figure 2B:
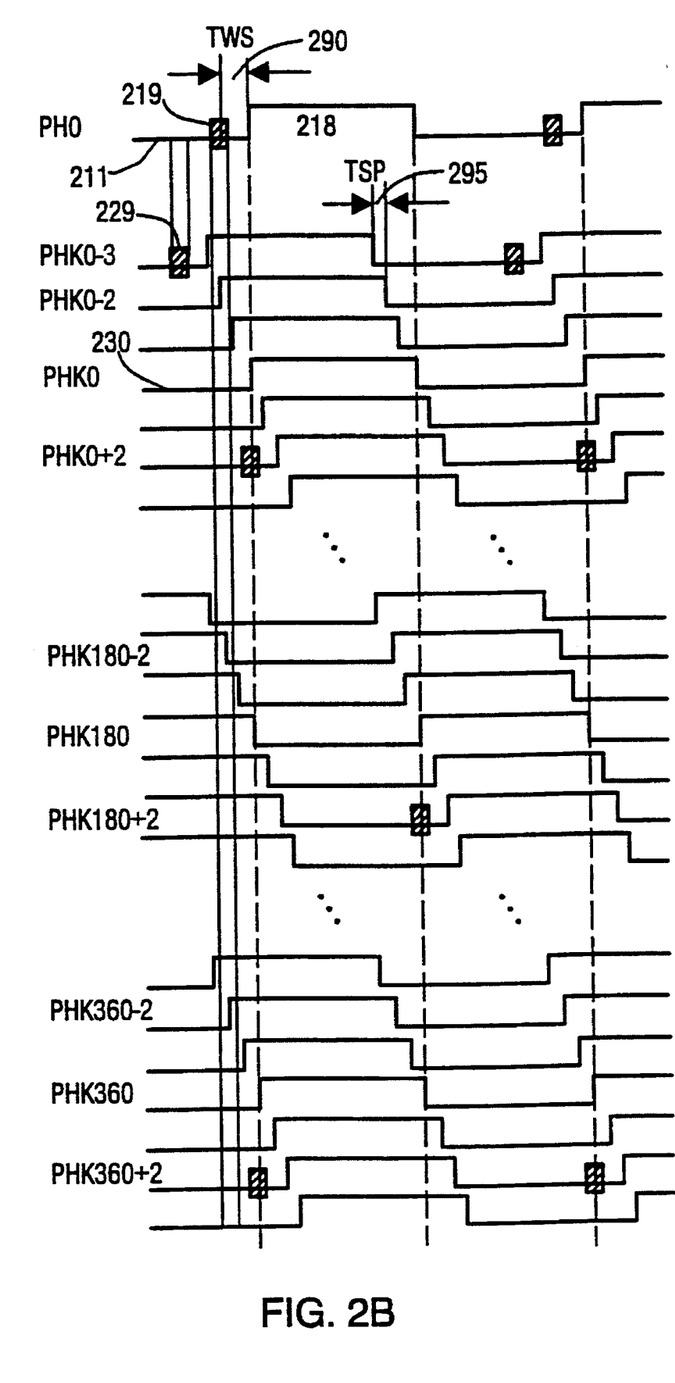
FIG. 2B is the timing diagram of the circuit in FIG. 2A.
Figure 2C:
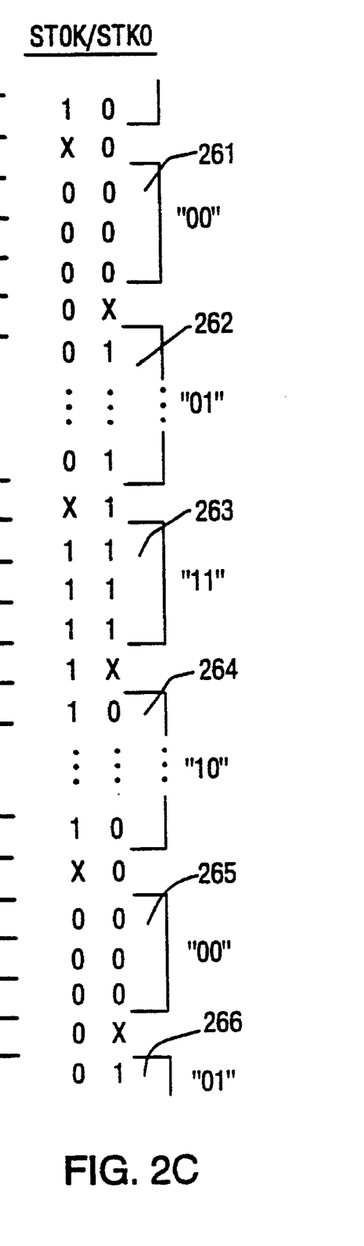
FIG. 2C is the output logic truth table of the circuit in FIG. 2A.

FIG. 2A is a circuit diagram of a novel all digital phase comparator according to my invention which is useful in phase decision circuit(s). The comparator includes DFF 201 and 202 along with delay DL 221 and 222. It is convenient to consider these as two DRW shifted DFF 251 and 252. Delay values of DL 221 and DL 222 could be fixed, or a digital command code 200 could be supplied to delay DL 221 and 222 to select the delay value so that the DRW shifting amount is selectable or programmable. A variable delay circuit such a DL 221 is more fully described in both of the co-pending applications incorporated herein by reference. The phase comparison of FIG. 2A uses the cross-sampling method, i.e., DFF 251 uses signal PH0 211 as the clock and signal PHK 212 as the data input, while DFF 252 uses PHK as its clock and PH0 as its data input. The operation of the comparator can be better understood by referring to FIG. 2B, the timing diagram. For this analysis, assume that signal PH0 and PHK are periodic signals having same frequency and duty cycle, and the duty cycle is 50%. The signal waveform of PH0 211 is shown on top of the figure with the DRW 219 associated with each clocking (rising) edge also shown. Signal PHK is shown in a series of time "shifted" waveforms each representing a instance when PHK and PH0 have a certain phase relationship. One such case is when PH0 is the input to a delay line, while the series waveforms representing PHK are the signal waveforms from tapped outputs of the delay line. The phase or time delay step size TSP 295 is then the delay value of the delay unit in the delay line. Waveform PHK0 230 represents the signal PHK instance when PHK and PH0 has zero phase difference, or zero delay time between the two. Waveform PHK360 represents the signal PHK instance when the phase difference between the two is 360 degrees or the delay is a full signal period. Accordingly, PHK180 is the waveform of PHK when the two have 180 degree phase difference, or the delay is a half signal period. The clocking edge of the PHK's are shifted one TSP each step as well as the DRW associated with that edge. Using the method described earlier, one can generate the status code STOK/STK0 of FIG. 2C at the two outputs STOK 231 and STK0 232, FIG. 2A. The status codes are shown in FIG. 2C, which is the output logic truth table for all the phases. STOK is the output of DFF 251, FIG. 2A, when PH0 is the clock to sample or read the various PHK waveforms as the D input. To determine the STOK status, we need to examine only the logic level of each PHK waveform instances during the DRW 219 "projected" period, or the time bounded by the two lines projected from the two edges of the DRW 219. If PHK is a stable "1" during DRW, STOK is "1"; if it is a stable "0", STOK is "0". If PHK is not a single level or if a transition is found during the period, a "x" results in STOK, such as illustrated the cases for waveforms PHK0-2, PHK180-2, and PHK360-2. In these instances, setup or hold time is violated so a metastable status occur. The determination of the STKO status code is performed similarly except that the PHK's are the clock signal while the PH0 is the data. For each PHK phase instances, the output STK0 is a "1" if the logic level of PH0 is "1" during the projected period of the associated DRW corresponding to that waveform instance, and is a "0" if the level is "0". As an example, PH0 211 is "0" during the time period projected from DRW 229 of signal instance PHK0-3, so the STK0 output code for the instance is a "0". As another example, PH0 has a transition during the DRW projected period of signal PHK, instance PHK+2, so the output STK0 for that instance is a "x". The entire status code or logic truth table can be generated using the method described and is shown in FIG. 2C.

The following conclusions can be reached based on the above discussion and by examining further the status codes in FIG. 2C:

1. A code combination of STOK and STK0 can be used to determine the phase relation of PH0 and PHK described above.

2. A code "00" results when the phase relation of the two signal PH0 and PHK are close to zero degree and integer multiples of 360 degree.

3. The "width" of the "00" zone or the number of PHK instances which result "00" code depends on the relative magnitude of step size TSP 295 and the DRW shifting TWS 290. Ideally, the magnitude of the Data Ready Window DRW is small and negligible comparing with the magnitude of the DRW shifting TWS 290. Thus the number of instances in the neighborhood of PHK0 and PHK360 which result in code "00" is two times TWS divided by TSP. In delay line approaches, TSP can be the minimum unit delay and is limited by the technology. DRW shifting TWS can also be generated to a selected value by cascading any number of minimum delay units as the delay component DL 221 and 222, FIG. 2A. As a result, the width of the "00" zone can be controlled by adjusting or selecting the number of delay units in DL 221 and 222, FIG. 2A. Since the value of DL is programmable by the digital code 200, the width of the "00" zone 261 is also programmable.

4. The same analysis holds true for the "11" zone 263 where the phase relation of the two signal PH0 and PHK is (2K+1) times 180 degree, where K is an integer.

5. There is a "01" zone 262 for phase relations of 0 through 180 degrees, and a "10" zone 264 for phase relations of 180 through 360 degrees.

6. If the width of the DRW 219 is smaller than the step size TSP 295, at most, one unknown "x" could occur at the boarder of each of the above zones. Even for these stages with an "x" as their status code, practically their output will still settle down at one of the two logic states if an adequate settle time is given. Therefore, the status code would be either of the two codes of the two adjacent zones. Accordingly, a "monotonic" code changing sequence 00-01-11-10-00- can be ensured.

Based on the above analysis, I have constructed a simple phase comparator by further decoding the STOK/STK0 code combination to generate an UP-DOWN signal to control a phase adjusting circuit for various phase adjustment purposes. The code "00" can be used as an "in-lock" indication upon which phase adjustment can be paused until code "00" is no longer true and adjustment is needed again. However, practical problems do exist which need to be solved.

In delay line based timing/phase control applications, the physical length of the delay line is limited. In the event that a delay line needs to be calibrated to delay a full signal cycle or to phase-shift a signal 360 degrees, a code "01" in FIG. 2C may represent completely different phase relations such that an opposite UP/DOWN level must be generated. For example, code "01" in zone 266 means that PHK is delayed or phase-shifted more than 360 degrees, so a "DOWN" or delay decrease is required, while the same code "01" in zone 262 means PHK is phase shifted less than 180 degrees, so delay increase is desired. In integrated circuit implementations, the delay value of the delay unit forming the delay line will vary with operating conditions and may need to be constantly detected and adjusted. Also, there are compromises in choosing the width of the "00" zone: if the width is too small, the code "00" or "in-lock" condition may never be reached due to changing and unstable delays; if the width of the "00" zone is too wide, large phase error will exist even when the signals are indicated "in-lock".

Figure 3A:
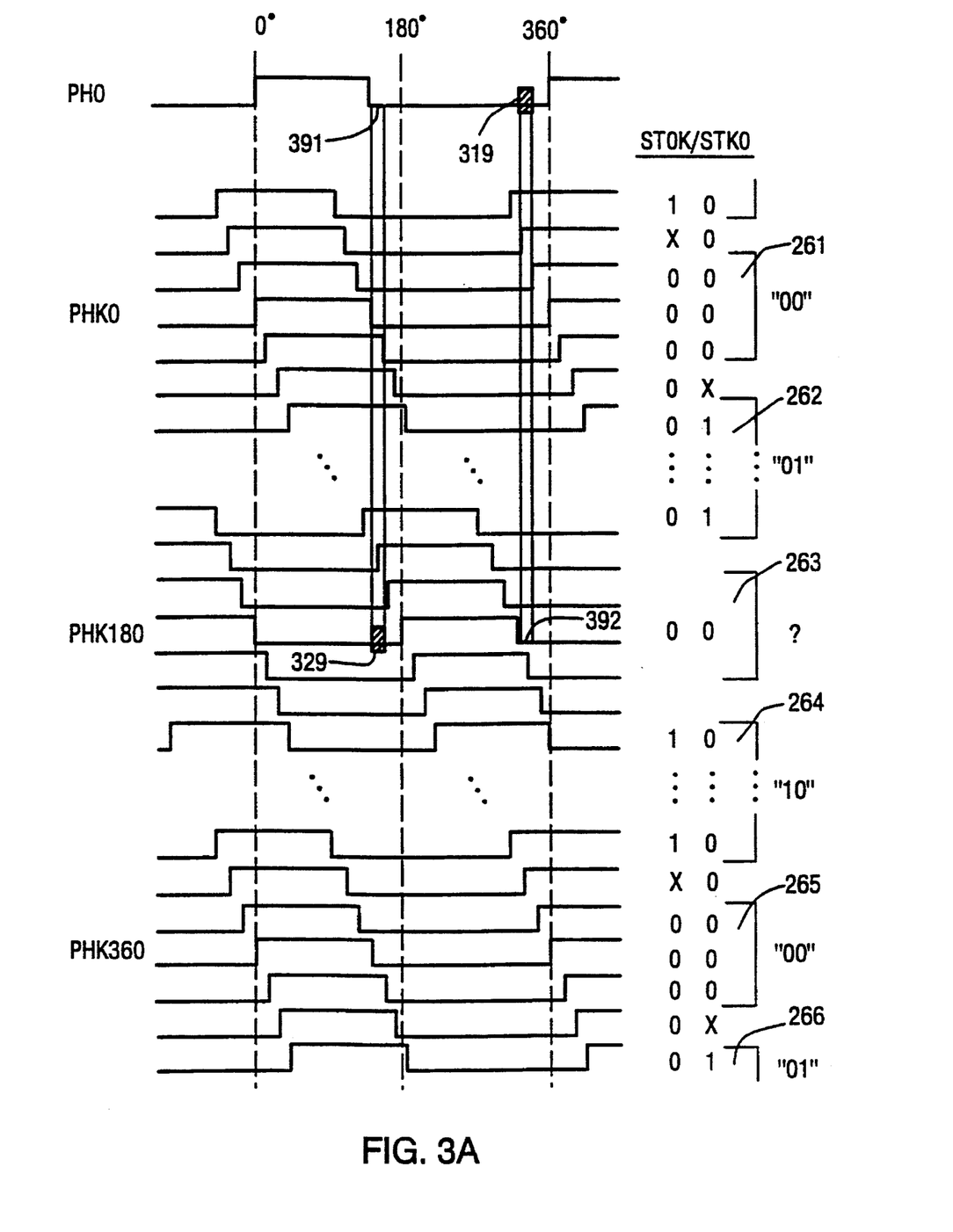
FIG. 3A is the timing diagram and truth table for the same circuit in FIG. 2A but the signal duty cycle is less than 50%.

We assumed in the above discussion that the signal duty cycle is 50% so the "monotonic" code sequence can be ensured during a 360 phase cycle. FIG. 3A is the timing diagram for the same circuit in FIG. 2A but the signal duty cycle is less than 50%. It has the same status code as those in FIG. 2B except zone 263 where code "00" is generated instead of "11". For PHK phase instances PHK180, it is 180 degree phase shifted from PH0. Differing from the previous 50% duty cycle, the clock-high in this case is less than 50% of the signal period. As a result, both DRW 319 for PH0 and DRW 329 for PHK180 read a "0" level of 391 and 392, so a code "00" is generated at outputs STOK 231 and STK0 232, FIG. 2A. This would destroy the "monotonic" code sequence and make the distinction between 180 degree phase difference and 360 degree phase difference impossible.

Figure 3B:
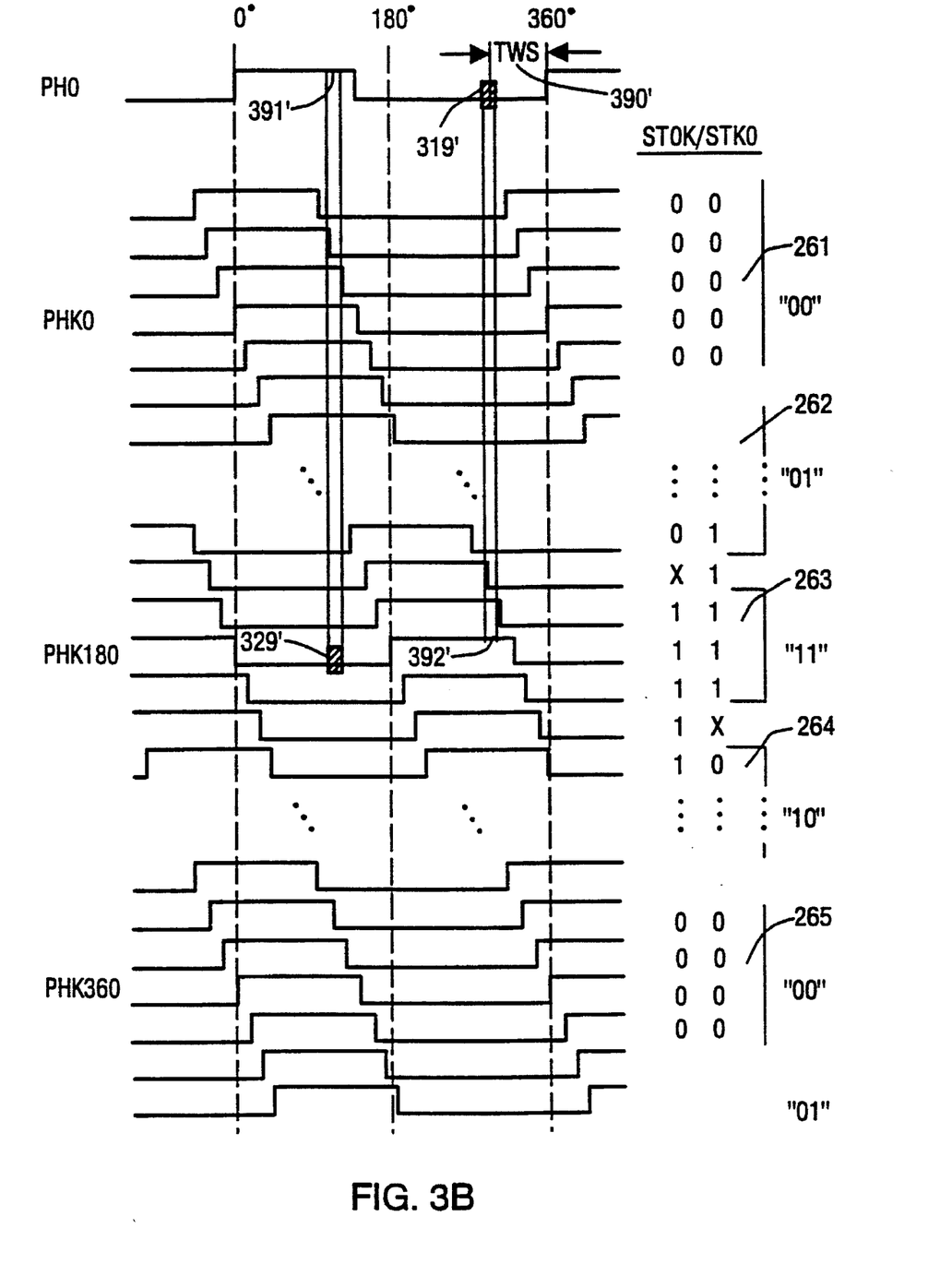
FIG. 3B is the timing diagram for the same signals in FIG. 3A but larger DRW shifting.

FIG. 3B is the timing diagram for the same signal duty cycle as in the previous case, FIG. 3A, but the DRW shifting TWS 390' is larger. For the instances where PH0 and PHK have about 180 degree phase differences (PHK180– through PHK180+), code "11" will be generated. This avoids the problem of the previous case and ensures the monotonic code sequence through the whole 360 degree cycle.

Figure 3C:
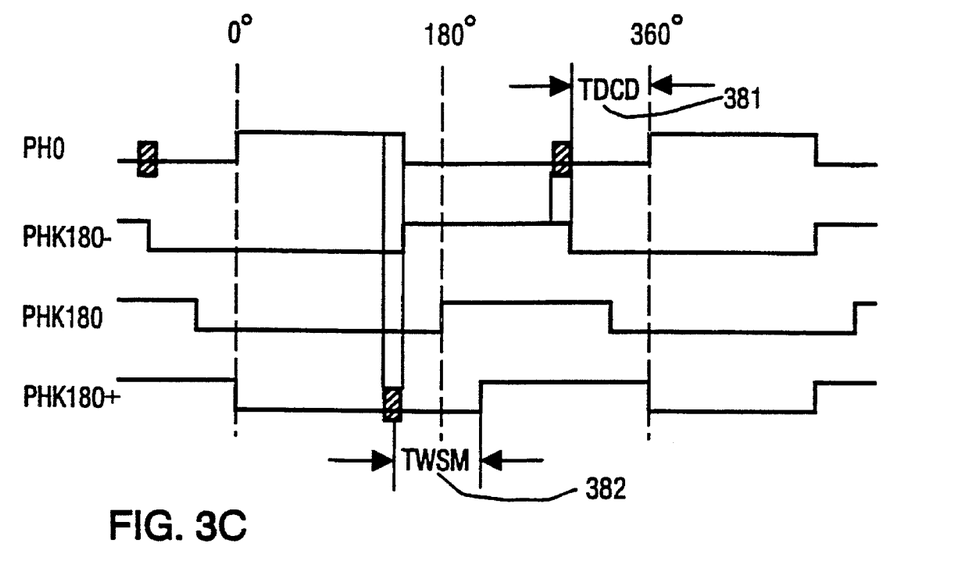
FIG. 3C is the timing diagram illustrating the DRW shifting requirements.
Figure 3D:
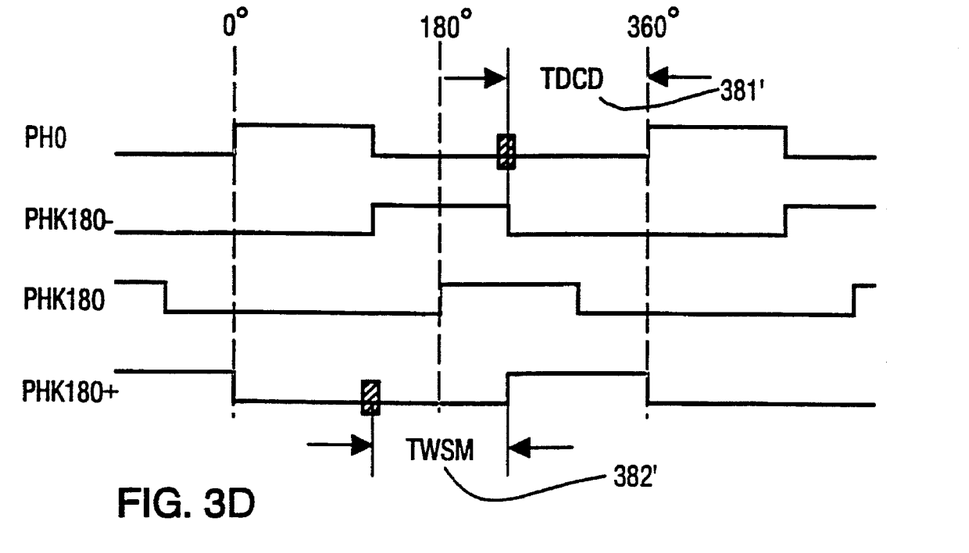
FIG. 3D is the timing diagram illustrating the maximum allowable signal duty cycle distortion using the DRW shifting method.

FIG. 3C illustrates the requirement of the DRW shifting in order to guarantee the code sequence monotonisity, i.e., to avoid "00" being produced when the phase difference is about 180 degrees. It is not difficult to observe from this figure that the problem of producing "00" code can be avoided if the DRW shifting TWSM 382 is greater than the maximum duty cycle distortion TDCD 381 (the absolute value of the difference between signal high time and signal low time.) However, there is a limit on how much duty cycle distortion can be handled by using this DRW shifting method. FIG. 3D shows that at 33% duty cycle, (or the ratio of the periodic signal high and signal low time is 1:2,) the DRW shifting TWSM 382' reaches the maximum since it equals TDCD 381' (the difference between signal high and signal low time.)

Figure 4A:
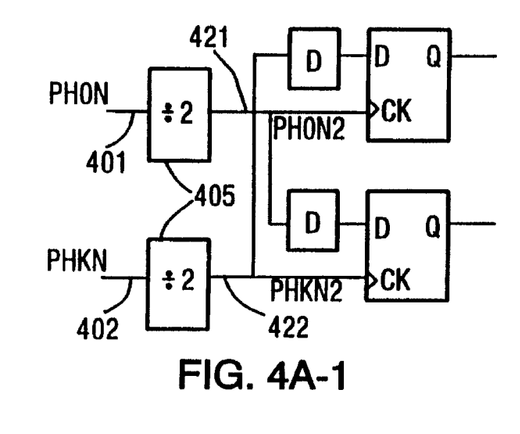
Figure 4A:
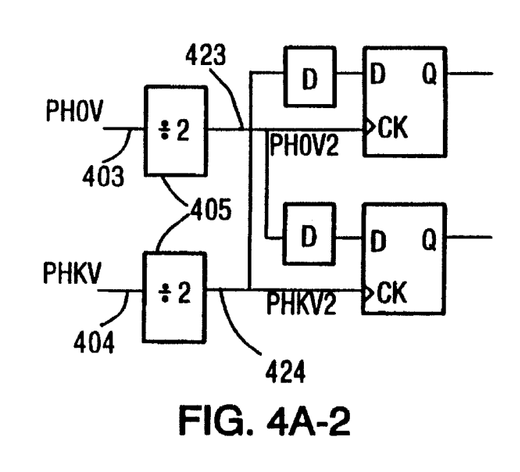
Figure 4B:
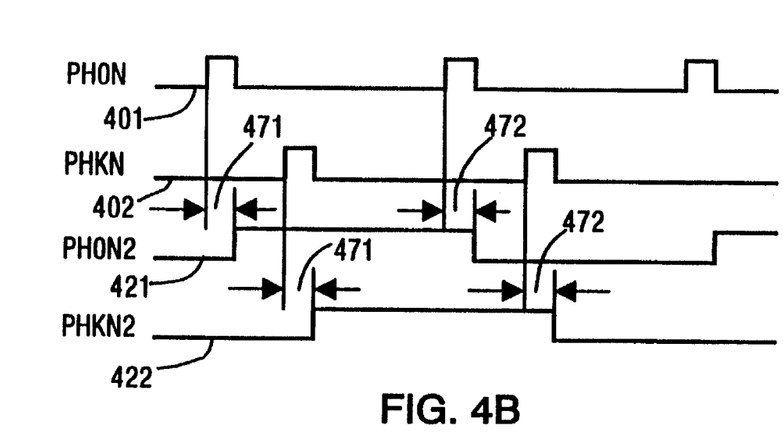
FIG. 4B is the timing diagram for FIG. 4A when the signals have a very narrow pulse width.
Figure 4C:
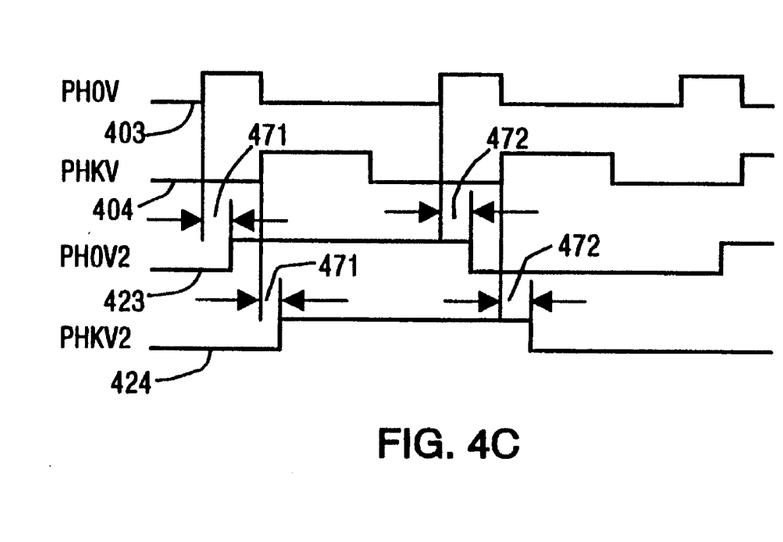
FIG. 4C is the timing diagram for FIG. 4A when the two signals to be phase-compared have different duty cycles.

FIG. 4A-1, 4A-2, 4B and 4C illustrate the modified phase comparator circuit and timing diagrams when the duty cycle of the two signal to be compared is smaller than 33% (PHON 401 and PHKN 402, FIG. 4B), or the two signals to be compared have different duty cycles (PHOV 403 and PHKV 404, FIG. 4C). In either case, the signals to be phase compared can be frequency-divided-by-two first, using standard logic Toggle-Flip Flop's (TFF) 405 to generate two signals PHON2, 421, PHKN2, 422, FIG. 4B, and PHOV2, 423, PHKV2, 424, FIG. 4C, each having 50% duty cycle and half of the original signal frequency. The requirement on the TFF are that they have a single input and each input rising pulse causes a change of state. Each TFF should have equal clock-to-Q-rising delay 471 and clock-to-Q-falling delay 472 to ensure 50% duty cycle of the signal waveforms generated. However, even if there is duty cycle distortions, the problem can be avoided by using the method described earlier. By using this compensation technique, the phase comparison is made every other signal cycles. This should not create a problem since in most applications the phase adjust circuit normally would not respond to phase errors based on a single signal cycle.

The apparatus and method of phase comparison described above can be applied to various phase decision circuits with one, two, or more phase in-lock zone. Also, each in-lock range can be programmable by varying the position of the Data Ready Window (DRW), In a phase-delay range calibration application, such as required in the co-pending application "Digital Full Range Rotating Phase Shifter," Ser. No. 08/021,691; filing date Feb. 24, 1993; inventor Bin Guo; AMD Docket Number A894, a phase decision circuit is needed to detect the phase relation of two delayed signals from the same original periodic clock signal, by two identical digital code controlled delay lines with different code settings. The control code for the first delay line is set to select the delay path with minimum delay, while the control code for the second delay line is from the outputs of an up/down bi-directional shift register, which is controlled by the said phase decision circuit. The control signals generated from the phase decision circuit are used for UP-shifting or DOWN-shifting the register to select the delay path in the second delay line which is the most appropriate path to make the delay difference of the two signal by a full signal period, i.e. the phase difference of the two is 360 degrees. The following discussion describes a preferred embodiment of such a phase comparator.

Figure 5:
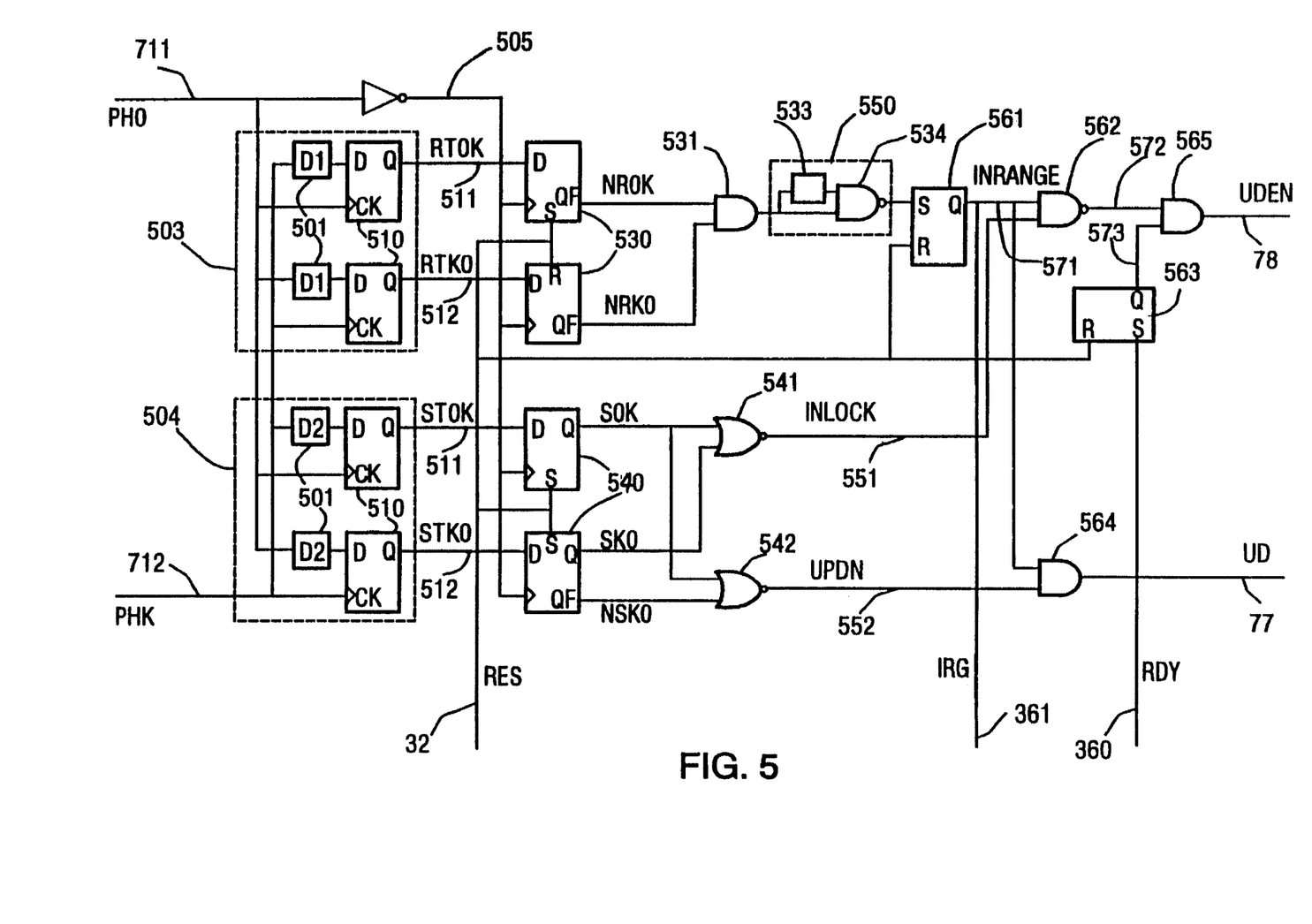
FIG. 5 is one embodiment of the programmable dual in-lock range phase comparator using the concept described in this invention.

FIG. 5 is the circuit diagram of the preferred embodiment of a phase decision circuit according to my invention. A pair of DFF 510 and delays 501 form the in-range detection phase comparator 503, while a pair of DFF 520 and delays 502 form the in-lock detection phase comparator 504. Both comparators are configured the same as that in FIG. 2A except for the digital code 200 control is not used. In this comparator, the value of the delays 501 and 502 are fixed. Status code combination STOK/STK0 (in-lock status code) 521/522 and RTOK/RTK0 (coarse in-range status code) 511/512 are generated upon the arrival of the rising edges of signal PH0 and PHK respectively. The generation of code "00" for the two circuits is not necessarily the same since delay 501 and 502 are preferably not the same. The delay value of delay 501 for the top in-range phase decision pair is greater than that of the delay 502 for the bottom in-lock phase decision pair.

Figure 6:
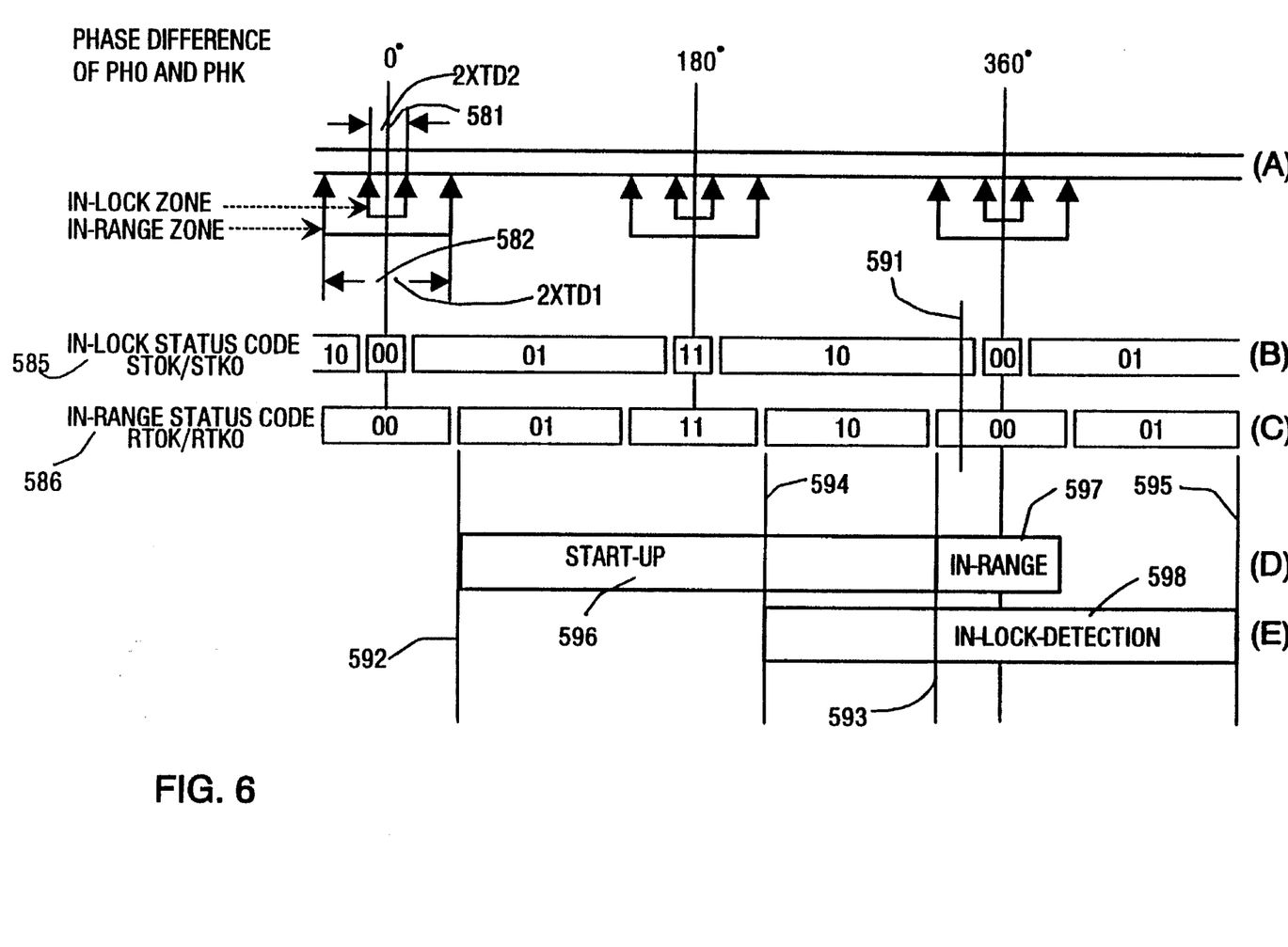
FIG. 6 is the illustrative diagram of the circuit in FIG. 5.

FIG. 6, row A shows the illustrative diagram showing the coarse in-range and fine in-lock phase detection zone, assuming that the setup-hold time for the DFF without delay is approximately zero so the DRW is located at the position aligned with the clocking edge. Then, the width of the in-range zone 582 is 2 times TD1 where TD1 is the delay value of delay D1 501, and the width of the in-lock zone 581 is 2 times TD2 where TD2 is the delay value of delay D2 502. In row 585, FIG. 6 row B the in-lock status code STOK/STK0 is shown for various phase relation conditions. The in-range status code RT0K/RTK0 is shown in row 586 FIG. 6 row C. Note the difference in the width of the "00" zones for these two. The status codes are not the same in certain conditions. For example, at the instance when the phase difference of PH0 and PHK is close to 360 degrees, as indicated by line 591, in-range status code RTOK/RTK0 is already "00", while the in-lock status code STOK/STK0 is still "10". Phase decisions can be made by observing and analyzing the two status codes.

With reference to FIG. 5 it is assumed that PHK lags PH0. Refer to Rig. 6, the delay path of the second delay line can be preset at the value where the initial phase difference of PHK and PH0 is in the region corresponding to the zones between line 592 and 593. In this region, i.e. the START-UP zone, 596, neither in-range nor in-lock condition are reached. The decision circuit then provides control commands to increase the delay value of the second delay line such that the phase difference of PHK and PH0 increases. In this initial process, or so-called Power-Up stage, the in-lock status code STOK/STK0 can be disregarded and command for a constant increase (UD 77 is a "1") can be given. Meanwhile, the delay adjustment enable signal (UDEN 78) is also a "1" to enable the "UP" adjustment of the delay value. This process continues until the in-range detection finds that the in-range condition is met, i.e. in-range status code RTOK/RTK0 becomes "00". The IN-RANGE zone 597 is reached, and from this point on the in-lock detection is activated and the detection takes place in the IN-LOCK-DETECTION zone 598. The status codes are updated every cycle, or every two cycles in the event a frequency divided-by-two is being used. Adjustment to the delay line can be made at the same rate as the status code update rate, or at a lower rate to accommodate some filtering functions. In any case, the phase difference is adjusted constantly to keep the phase difference of the two signals close to 360 degrees. In an integrated circuit implementation, disturbances such as power supply noise and temperature variations can cause the delay value to change so the phase relation change. However, it is very unlikely that the variation is so dramatic that the phase relation change will cause the detected in-lock status code to move out of the IN-LOCK-DETECTION zone 598 in one or two signal cycles. On the assumption that the phase relation of the two signals PH0 and PHK will remain in the corresponding IN-LOCK-DETECTION zone after the first pass from the initial START-UP process corresponding to zone 596. Therefore, the control signals for the delay adjustment can be generated from the two sets of status codes:

| STOK/STK0 | RTOK/RTK0 | UD | UDEN |
|---|---|---|---|
| 10 | XX | 1 | 1 |
| 00 | 00 | X | 0 |
| 01 | XX | 0 | 1 |

With reference to FIG. 5, the circuit diagram of the combination logic of the preferred embodiment of the phase decision circuit, DFF pair 530 and 540 are used to synchronously latch the status code of in-range detector 503 and in-lock detector 504 on the falling (inverted) edge of signal PH0 on line 505. INLOCK 551 is always a "0" except when the in-lock status code STOK/STK0 is "00", so that SOK/SK0 or both inputs to NOR gate 541 are "0" to cause its output to be a "1", in which case UDEN=1, to enable delay or phase adjustments. The status of INLOCK 551 and UPDN 552 are not activated during the initial START-UP process, since reset signal RES 32 resets both RS Flip-Flop (RSFF) 561 and 563 such that INRANGE signal on line 571 is "0" which prevents INLOCK and UPDN status to get through to affect the output signals UDEN 78 and UD 77. The up/down enable signal UDEN 78 remains "1" to enable delay adjustment until "in-range" condition is satisfied such that INRANGE 361 becomes "1". The output of NAND gate 562 is further gated by AND gate 565 until a input-ready signal RDY 360 arrives to set RSFF 563. DFF pair 530 is reset to "10" at start, and the initial delay value setting ensures that the initial in-range status code RTOK/RTK0 is not "00", so AND gate 531 output on line 532 remains "0" for the entire START-UP period. When the delay increment finally brings the phase relation of the two signal PH0 and PHK into "in-range" condition, status code RTOK/RTK0 becomes "00". The output of DFF pair 530 NROK/NRK0 becomes "11". A low-to-high transition takes place at the output of AND gate 531. This rising edge causes the one-shot circuit 550 (formed by NAND gate 534 and delay 533, the delay value of which determines the pulse width of the one-shot) to output a narrow pulse which subsequently set the output of RSFF 561, INRANGE 571 to "1". From this time on the status of INLOCK 551 is gated through to output to determine up/down enable signal UDEN 78, and the status of UPDN 552 also gets through to output UD 77 and determines the delay adjustment direction. This invention has been described in conjunction with the above preferred embodiments. However, the invention is not intended to be restricted to these embodiments and the scope of the invention shall be determined by the claims. With this in view:

I claim:

1. A new method for using a flip flop circuit including a first pair of D type flip flops including first DFF and second DFF DFF as a digital phase comparator for indicating the phase angle relationship between a first binary signal PHO and a second binary signal PHK wherein said first and second binary signals exhibit a duty cycle distortion TDCD and wherein said first DFF has a clock input, a D input and an RTOK output and said second DFF has a clock input, a D input and an RTKO output comprising, connecting said PHO signal to said clock input of said first DFF and delaying said PHO signal by a first delay time TWSM, where TWSM is greater than said duty cycle distortion TDCD, and feeding said delayed PHO signal to said D input of said second DFF;

connecting said PHK signal to the clock input of said second DFF and delaying said PHK signal by a second delay time where said second delay time is greater than said duty cycle distortion and feeding said PHK signal to the D input of said first DFF;

simultaneously sampling and latching the levels of said RTOK output and RTKO output;

analyzing the logic levels of said latched RTOK output and RTKO output in combinatorial logic and providing a plurality of unique phase range indications including a smallest phase range indication, which range indications are indicative of whether PHK needs to be delayed more or less or whether the phase angle is within the smallest indicator phase range of said first pair of flip flops with respect to a phase angle between PHO and PHK of 360 degrees.

2. The method of claim 1 wherein said first delay time equals the delay time of said second delay time.

3. A new method for using a flip flop circuit including a first pair of D type flip flops including first DFF and second DFF DFF as a digital phase comparator for indicating the phase angle relationship between a first binary signal PHO and a second binary signal PHK wherein said first and second binary signals exhibit a duty cycle distortion TDCD and wherein said first DFF has a clock input, a D input and an RTOK output and said second DFF has a clock input, a D input and an RTKO output comprising, connecting said PHO signal to said clock input of said first DFF and delaying said PHO signal by a first delay time TWSM, where TWSM is greater than said duty cycle distortion TDCD, and feeding said delayed PHO signal to said D input of said second DFF;

connecting said PHK signal to the clock input of said second DFF and delaying said PHK signal by a second delay time where said second delay time is greater than said duty cycle distortion and feeding said PHK signal to the D input of said first DFF;

simultaneously sampling and latching the levels of said RTOK output and RTKO output;

analyzing the logic levels of said latched RTOK output and RTKO output in combinatorial logic and providing a plurality of unique phase range indications including a smallest phase range indication, which range indications are indicative of whether PHK needs to be delayed more or less or whether the phase angle is within the smallest indicator phase range of said first pair of flip flops with respect to a phase angle between PHO and PHK of 360 degrees;

a second pair of D type flip flop connected to said PHO and PHK, said second pair of D type flip flops including a third and fourth D flip flop DFF, said third and fourth DFF being interconnected to said PHO and to said PHK and to one another in exactly the same manner as said first and second DFF, wherein said third DFF has an output STOK and said fourth DFF has an output STKO;

feeding said PHO signal to the clock input of said third DFF and delaying said PHO signal by a third time delay and feeding said delayed PHO signal to the D input of said fourth DFF;

feeding said PHK signal to the clock input of said fourth DFF and delaying said PHK signal by a fourth delay time and feeding said PHK signal to the D input of said third DFF, said third and fourth time delays being of equal delay time but where said third and fourth time delays do not equal the delay of said first delay time or said second time delay;

simultaneously sampling and latching the levels of said STOK and STKO;

analyzing the logic levels of said STOK and STKO in combinatorial logic and providing a plurality of unique phase range indications including a smallest phase range indication, which range indications are indicative of whether PHK needs to be delayed more or less or whether the phase angle between PHO and PHK is within the smallest phase range indication of said second pair of flip flops.

4. The method of claim 3 wherein said first time delay and said second time delay are both longer than said delay of said third or fourth time delay so that the phase range of the said smallest phase range indication of said first and second DFF is larger than the phase range of the smallest phase range indication of said third and fourth DFF.

5. The method of claim 4 wherein said smallest phase range indication of said first and second DFF provides a coarse in-range status code control logic signal and said smallest phase range indication of the said third and fourth pair of flip flops provides a fine in-lock status code control logic signal.

6. A digital phase comparator circuit for comparing the time delay between a first and second binary signal comprising:

a first flip flop unit FF1 unit, said FF1 unit having a first and second input terminals and one output terminal, one of said FF1 unit input terminals being a terminal to receive said first binary signal, said FF1 unit including a first and second delay element;

a second flip flop unit FF2 unit, said FF2 unit having a first and second input terminals and one output terminal, one of said FF2 unit input terminals being a terminal to receive said second binary signal, said FF2 unit including a first and second delay element;

said FF1 unit and said FF2 unit including the same flip flop type; and said first input terminal of said FF1 unit being connected to said second input terminal of said FF2 unit and said second input terminal of FF1 unit being connected to said first input terminal of FF2 unit, said FF1 unit and said FF2 unit both including, (i) a first and second D flip flop DFF, each said DFF having a clock input and a D input, said clock input of said first DFF being connected to said first input terminal of said FF1 and said clock input of said second DFF being connected to said second input terminal of said first FF1; and (ii) each said delay element having an input and an output; said output of said first delay element being connected to said D input of said first DFF and said output of said second delay element being connected to said D input of said second DFF, where said first delay element input of said FF1 unit is connected to said second input terminal of said FF1 unit and wherein said first delay element input of said FF2 unit is connected to said second input terminal of said FF2 unit, and where said second delay element input of said FF1 unit is connected to said first input terminal of said FF1 unit and wherein said second delay element of said FF2 unit is connected to said first input terminal of said FF2 unit; and latch means, said latch means being a third FF3 and fourth FF4 D type flip flop, each said FF3 and FF4 having a D input, a clock input, and an output, said D input of said FF3 and FF4 being connected to said output terminal of said first D flip flop of FF1 unit and to said output terminal of said second D flip flop of FF1 unit respectively, said FF3 and FF4 being connected to detect and hold the state of the output at said output terminal of said first and second D flip flops respectively of said FF1 unit, said clock inputs of said FF3 and FF4 being connected together and to a terminal for receiving a clocking pulse.

7. The comparator of claim 6 further comprising a fifth flip flop FF5 and a sixth flip flop FF6, both said FF5 and FF6 having a first and second inputs, and an output, said first inputs of said FF5 and said FF6 being a D input and said second inputs of said FF5 and FF6 being a clock terminal, said D inputs of said FF5 and FF6 being connected to said output terminal of said first D flip flop of said FF2 unit and said output terminal of said second D flip flop of said FF2 unit, said clock terminals of FF5 and FF6 being connected together for receiving said clocking pulse.

8. The comparator of claim 7 wherein the clock terminal input of said FF3, FF4, FF5 and FF6 are connected to one of said inputs of FF1 unit.

9. The comparator of claim 8 wherein said clock terminals of said FF3, FF4, FF5 and FF6 are connected through an inverter to said terminal to receive said first binary signal.

10. The comparator of claim 9 wherein the delay of said first and second delay element of FF1 unit are equal to a first delay value.

11. The comparator of claim 9 wherein the delay of said first and second delay elements of FF2 unit are equal to a second delay value.

12. The comparator of claim 11 wherein said first delay value is less than said second delay value.

13. The comparator of claim 7 including compensation means for small duty cycle values, said compensation means being a divider connected to each said first and second input terminals to receive said binary signals to provide a corrected version of said binary signals by reducing duty cycle distortion by division of the frequency of said binary signals and for passing said corrected version of said binary signals to said FF1 unit and said FF2 unit respectively.

14. The comparator of claim 13 wherein said compensation means comprises a first and second frequency divider circuit, said first divider being coupled to receive said first binary signal and said second divider being coupled to said second binary signal.

15. The comparator of claim 7 including a combinatorial logic circuit, and wherein said outputs of said FF3, FF4, FF5 and FF6 are connected to said combinatorial logic circuit, said combinatorial logic circuit providing two output binary signals which indicate whether the phase of the first and second binary signals being compared are in lock and if in which direction to adjust the delays improve the phase angle match.

16. A method of comparing the phase of a first and second binary signal wherein at least one of said first and second binary signals exhibit duty cycle distortion TDCD comprising:

delaying each said first and second binary signals by an amount TWSM to provide a first delayed signal and a second delayed signal respectively, said amount TWSM being greater than said TDCD;

sampling said first binary signal by said second delayed signal and storing the sampled level in a first latch;

sampling said second binary signal by said first delayed signal and storing the sampled level in a second latch;

combinatorially analyzing said stored values in said latches, and providing a unique logic level indication of the phase relationship of said first and second binary signals.

17. The method of claim 16 wherein both said first and second binary signals are obtained by reducing an original pair of signals in frequency by dividing the frequency of both said original pairs of signals by the same divisor.

* * * * *